United States Patent [19]

Yoshizaki et al.

[11] Patent Number: 4,616,895
[45] Date of Patent: Oct. 14, 1986

[54] INTEGRATED CIRCUIT SOCKET

[75] Inventors: Tsutomu Yoshizaki, Yokosuka; Toshimasa Ishii, Yokohama, both of Japan

[73] Assignee: Fujitsu Limited, Kanagawa, Japan

[21] Appl. No.: 774,182

[22] Filed: Sep. 9, 1985

Related U.S. Application Data

[63] Continuation of Ser. No. 534,213, Sep. 20, 1983, abandoned.

[30] Foreign Application Priority Data

Sep. 29, 1982 [JP] Japan .................. 57-168276

[51] Int. Cl.[4] .......................................... H01R 13/627
[52] U.S. Cl. ........................... 339/17 CF; 339/91 R
[58] Field of Search .......... 339/17 CF, 174, 91 R, 339/75 M, 75 MP

[56] References Cited

U.S. PATENT DOCUMENTS

| | | | |
|---|---|---|---|
| 3,892,312 | 7/1975 | Tems | 339/17 CF |
| 3,951,495 | 4/1976 | Donaher et al. | 339/17 CF |
| 4,018,494 | 4/1977 | Scheingold et al. | 339/17 M |
| 4,070,081 | 1/1978 | Takahashi | 339/91 R |
| 4,330,163 | 5/1982 | Aikens et al. | 339/17 CF |
| 4,331,373 | 5/1982 | Demnianiuk | 339/91 R |
| 4,401,352 | 8/1983 | Heisey | 339/17 CF |

FOREIGN PATENT DOCUMENTS 0030763 6/1981 European Pat. Off. .
2392575 12/1978 France .

OTHER PUBLICATIONS

Computer, vol. 10, No. 12, Dec., 1977, Long Beach, J. W. Balde et al., "New Chip Carrier Package Concepts", pp. 58–68.

Primary Examiner—Neil Abrams
Attorney, Agent, or Firm—Armstrong, Nikaido, Marmelstein & Kubovcik

[57] ABSTRACT

An integrated circuit (IC) socket comprising: a box-shaped housing of dielectric material open at the upper side thereof and having a recess for receiving a leadless chip carrier type of IC device; a plurality of contacts for contacting the electrodes of the IC device within the recess, each of the contacts comprising a springy conductive member and being disposed in the bottom of the housing so as to contact the electrodes formed in the bottom surface of the IC device; and two pairs of pressing members arranged at opposite corners for holding the IC device within the recess, each member comprising a springy member and a projection formed at the top end of the springy member for pressing the IC device. The projections on the pressing members are semi-circular-shaped to permit easy insertion and removal, and to maintain downward pressure.

6 Claims, 4 Drawing Figures

INTEGRATED CIRCUIT SOCKET

This application is a continuation of application Ser. No. 534, 213 filed Sept. 20, 1983 now abandoned.

BACKGROUND OF THE INVENTION

1. Field of the Invention

The present invention relates to an integrated circuit (IC) socket for receiving an IC device.

2. Description of the Prior Art

An IC socket is used for receving and IC device such as a leadless chip carrier (LCC) when the IC device is burn-in tested and checked by various characteristic methods. An IC socket is mounted on a printed board and is connected to circuit patterns formed thereon for testing the IC device.

An IC socket is also used in various electronic circuits in which some of the IC devices thereof are dismountably installed in IC sockets instead of being directly mounted on a printed board and secured thereto so that the IC devices can be easily removed and easily replaced with other IC devices.

The above-mentioned IC socket is box-shaped and the upper side thereof is open. The IC device is inserted into the IC socket through the opening thereof and is housed therein. A plurality of contacts corresponding to the electrodes of the IC device to be received therein are provided in the IC socket.

The electrodes of the LCC are formed on the four side surfaces of the box-shaped LCC, the lower end of each electrode slightly extending toward the bottom surface thereof. The contacts of the conventional IC socket are disposed on the side walls of the box-shaped IC socket and resiliently press the LCC from the four sides thereof so as to hold the LCC and contact the electrodes formed on the side faces of the LCC. This type of conventional IC socket is large since the contacts thereof are disposed on the periphery of the LCC to be housed therein. Such a large IC socket is not desirable for mounting a plurality of LCCs compactly on a printed board. Also, the conventional IC socket is less manipulatable when the number of contacts is increased since an increased number of contacts increases the resistance to insertion of and removal of the LCC.

SUMMARY OF THE INVENTION

The present invention makes it possible to eliminate the above-mentioned drawbacks of the prior art.

It is a purpose of the present invention to provide an IC socket which is compact, which has a simple construction, and which can be easily manipulated.

An IC socket in accordance with the present invention comprises: A box-shaped housing of dielectric material open at the upper side thereof and having a recess for receiving an LCC type of IC device; a plurality of contacts for contacting the electrodes of the IC device within the recess, each of the contacts comprising a springy conductive member and being disposed in the bottom of the housing so as to contact the electrodes formed in the bottom surface of the IC device; and a plurality of pressing members for holding the IC device within the recess, each member comprising a springy member and a projection formed at the top end of the springy member for pressing the IC device.

DESCRIPTION OF THE PREFERRED EMBODIMENTS

The embodiments of the present invention are described with reference to the drawings.

Figure 1:
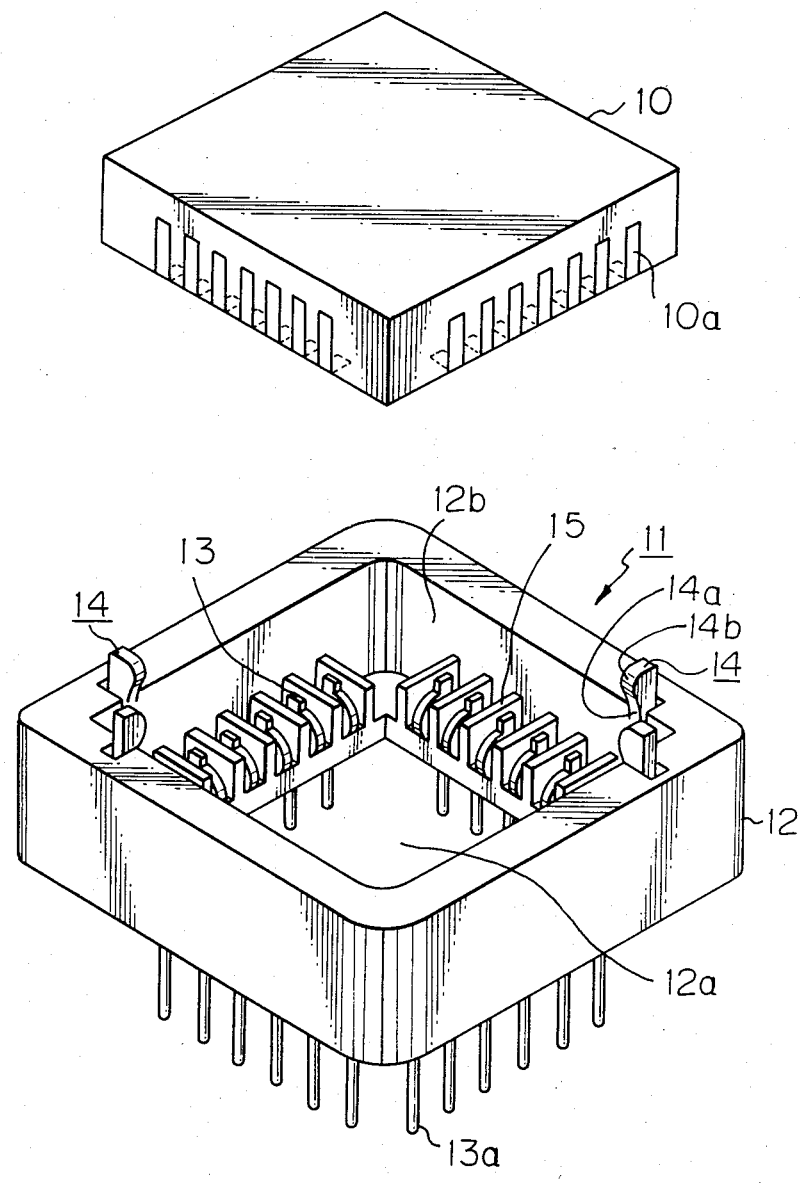
FIG. 1 is a perspective view of an IC socket according to the present invention.
Figure 2:
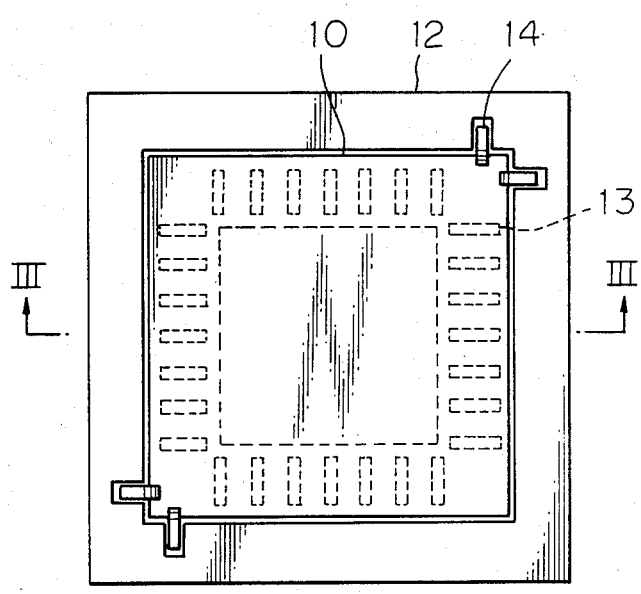
FIG. 2 is a plan view of the IC socket of FIG. 1.
Figure 3:
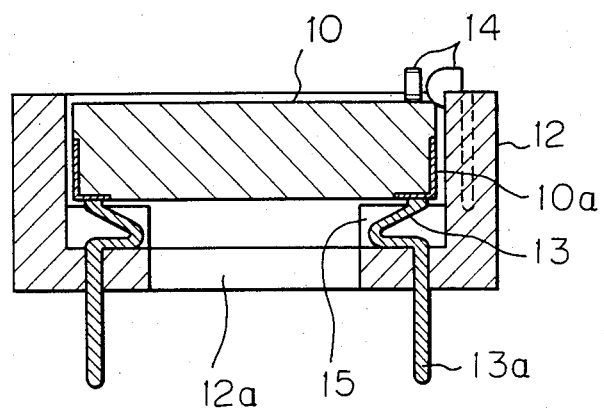
FIG. 3 is a sectional view of the IC socket of FIG. 1 along the line III—III of FIG. 2.

An LCC-type IC device 10 comprises a plurality of electrodes 10a disposed on the four side faces thereof. The lower end of each electrode 10a extends to the bottom face of the IC device 10. An IC socket 11 of the present invention comprises: a box-shaped housing 12 of dielectric material open at the upper side thereof and having a recess 12b for receiving the IC device 10; a plurality of contacts 13 which contact the electrodes 10a of the IC device 10 from the bottom side thereof; and a plurality of pressing members 14 for preventing the IC device 10 from slipping out of the housing 12. Each contact 13 has a curved portion at the inner side thereof so as to make the contact springy, as is illustrated in FIGS. 1 and 3. The upper end of each contact 13 contacts the lower portion of an electrode 10a formed on the bottom face of the IC device 10. The lower end of each contact 13 constitutes a lead terminal 13a for attaching the IC socket 11 to a printed board (not shown). The contacts 13 are integrated with the housing 12 by an insert-molding process, with the lead terminals 13a projecting out of the housing 12. The arrangement of the contacts 13 corresponds to the arrangement of the electrodes 10a of the IC device 10.

The pressing members 14 are integratedly formed with the housing 12. Each pressing member 14 comprises a springy member 14a and a semicircular-shaped projection 14b formed at the top end of the springy member 14a. When the IC device 10 is inserted into the recess 12b of the housing 12, the IC device 10 abuts against the projections 14b of the pressing members 14 and the projections 14b are resiliently pushed outward. After the IC device 10 is inserted into the recess 12b of the housing 12, the pressing members 14 retract so that the projections 14b thereof press the upper surface of the IC device 10 against the upward springy force of the contacts 13 and hold the IC device 10 within the housing 12.

Each contact 13 is separated from the adjacent contacts 13 by a partition 15.

An opening 12a is formed on the bottom plate of the housing 12. If it is necessary to remove the IC device 10 from the housing 12 before the IC socket 11 is secured to the printed board, the IC device 10 can be easily removed therefrom by pushing the bottom face of the IC device 10 upward through the opening 12a of the housing 12.

The IC socket 11 is mounted on the printed board by inserting the lead terminals 13a into through holes of the printed board and soldering them thereto.

Figure 4:
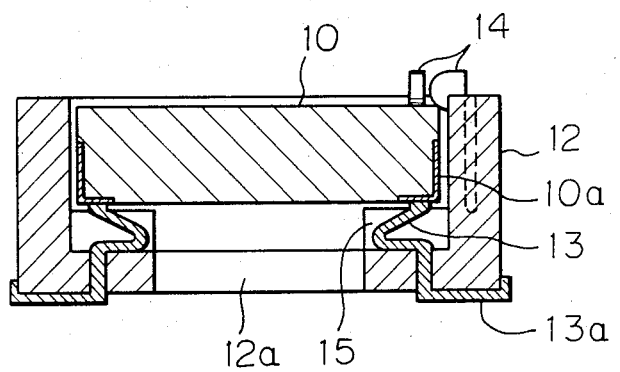
FIG. 4 is a sectional view of another IC socket according to the present invention.

The lead terminal 13a of each contact 13 may be folded so as to be disposed on the lower surface of the housing 12 and contact the housing 12, as is illustrated in FIG. 4, instead of projecting downward out of the housing 12, as is illustrated in FIG. 3. The IC socket provided with such folded lead terminals 13a is mounted on the printed board in such a manner that the folded lead terminals 13a are disposed on and are directly soldered to the circuit pattern formed on the printed board without using the through holes of the printed board. The IC socket of FIG. 4 can be mounted on the upper surface of a large IC device having circuit patterns formed thereon instead of being mounted on the printed board.

In accordance with the present invention, it is possible to make the IC socket small since the contacts 13 are disposed in the bottom thereof, instead of on the periphery of the IC device, so as to contact the IC device from the bottom side thereof. The resistance to insertion of the IC device into the IC socket, which resistance is the sum of the springy force of the contacts 13 and the springy force of the pressing members 14, is very small as compared with the prior art, in which the contacts are disposed on the periphery of the IC device so as to contact the side faces of the IC device. The resistance to withdrawal of the IC device from the IC socket is also small since it is only the springy force of the pressing members 14. Therefore, the IC device can be easily inserted and withdrawn.

We claim:

1. An IC socket for an IC device such as a quadrilateral-shaped leadless chip carrier having a bottom surface, and a plurality of electrodes formed on the bottom surface, said IC socket comprising:

a box-shaped housing of dielectric material opening at an upper side thereof and having a quadrilateral-shaped recess for receiving said IC device and a bottom;

a plurality of contacts for contacting with said electrodes of said IC device within said recess, each of said contacts comprising a springy conductive member and being disposed in the bottom of said housing so as to contact with the electrodes formed on the bottom surface of said IC device; and two pairs of pressing members for holding said IC device within said recess, each pressing member being formed as one body integral with said housing and comprising a springy member extending vertically in said recess with an inwardly projecting rounded projection formed at a top end of said springy member for pressing said IC device, said two pairs of pressing members being arranged at the sides of said socket at two diagonally opposed corners of said recess in such a manner that a pressing member of each pair engages with a different side edge of said IC device, at each of two diagonally opposed corners, while the other two diagonally opposed corners of said recess and the sides adjacent thereto are not provided with any pressing members whereby the edges of said IC device thereat are accessible for withdrawal of said IC device from said upper side against force exerted by said pressing members.

2. An IC socket as set forth in claim 1, in which said housing has a partition of dielectric material disposed between every two adjacent contacts.

3. An IC socket as set forth in claim 1, in which said housing has an opening formed at the bottom thereof.

4. An IC socket as set forth in claim 1, in which the end of each contact constitutes a lead terminal which projects downward out of said housing from the bottom face thereof.

5. An IC socket as set forth in claim 1, in which the end of each contact constitutes a lead terminal which is folded at the lower face of said housing so as to be disposed on the lower face of said housing and contact said housing.

6. An IC socket as set forth in claim 1 wherein said rounded projection of said pressing members is semicircular in shape providing rounded corners at both the upper and lower edges thereof whereby insertion and withdrawal of said IC device may be accomplished solely by pressure on said IC device, and said rounded projection presses said inserted IC device against said contacts.

* * * * *